United States Patent
Bi et al.

(10) Patent No.: US 10,381,476 B2
(45) Date of Patent: Aug. 13, 2019

(54) VERTICAL TRANSPORT FIN FIELD EFFECT TRANSISTORS ON A SUBSTRATE WITH VARYING EFFECTIVE GATE LENGTHS

(71) Applicant: INTERNATIONAL BUSINESS MACHINES CORPORATION, Armonk, NY (US)

(72) Inventors: Zhenxing Bi, Niskayuna, NY (US); Kangguo Cheng, Schenectady, NY (US); Juntao Li, Cohoes, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/000,264

(22) Filed: Jun. 5, 2018

(65) Prior Publication Data
US 2018/0294352 A1 Oct. 11, 2018

Related U.S. Application Data

(62) Division of application No. 15/463,314, filed on Mar. 20, 2017, now Pat. No. 10,043,900.

(51) Int. Cl.
*H01L 29/417* (2006.01)
*H01L 29/78* (2006.01)
(Continued)

(52) U.S. Cl.
CPC ...... *H01L 29/7827* (2013.01); *H01L 21/3086* (2013.01); *H01L 21/76224* (2013.01);
(Continued)

(58) Field of Classification Search
CPC ............ H01L 27/0886; H01L 27/0924; H01L 27/10826; H01L 27/1211; H01L 29/41791
See application file for complete search history.

(56) References Cited

U.S. PATENT DOCUMENTS

| 6,359,311 B1 | 3/2002 | Cotinge et al. |
| 6,632,712 B1 | 10/2003 | Ang et al. |

(Continued)

FOREIGN PATENT DOCUMENTS

| JP | 2012-4510 | 1/2012 |
| KR | 1020140157180 | 9/2016 |

OTHER PUBLICATIONS

List of IBM Patents or Patent Applications Treated as Related dated Jun. 5, 2018, 2 pages.

(Continued)

*Primary Examiner* — Jae Lee
(74) *Attorney, Agent, or Firm* — Tutunjian & Bitetto, P.C.; Vazken Alexanian

(57) ABSTRACT

A method of forming vertical transport fin field effect transistors, including, forming a bottom source/drain layer on a substrate, forming a channel layer on the bottom source/drain layer, forming a recess in the channel layer on a second region of the substrate, wherein the bottom surface of the recess is below the surface of the channel layer on a first region, forming a top source/drain layer on the channel layer, where the top source/drain layer has a greater thickness on the second region of the substrate than on the first region of the substrate, and forming a vertical fin on the first region of the substrate, and a vertical fin on the second region of the substrate, wherein a first top source/drain is formed on the vertical fin on the first region, and a second top source/drain is formed on the vertical fin on the second region.

20 Claims, 11 Drawing Sheets

(51) Int. Cl.
*H01L 29/66* (2006.01)
*H01L 29/08* (2006.01)
*H01L 29/10* (2006.01)
*H01L 21/8234* (2006.01)
*H01L 21/762* (2006.01)
*H01L 29/06* (2006.01)
*H01L 27/088* (2006.01)
*H01L 21/308* (2006.01)

(52) U.S. Cl.
CPC .......... *H01L 21/823412* (2013.01); *H01L 21/823418* (2013.01); *H01L 21/823487* (2013.01); *H01L 27/088* (2013.01); *H01L 29/0649* (2013.01); *H01L 29/0847* (2013.01); *H01L 29/1037* (2013.01); *H01L 29/6656* (2013.01); *H01L 29/66666* (2013.01); *H01L 29/785* (2013.01); *H01L 21/823481* (2013.01)

(56) References Cited

U.S. PATENT DOCUMENTS

| | | | |
|---|---|---|---|
| 6,717,200 B1 | 4/2004 | Schamberger et al. | |
| 7,960,287 B2 | 6/2011 | Johnson et al. | |
| 8,212,311 B2 | 7/2012 | Masuoka et al. | |
| 8,999,791 B2 | 4/2015 | Cheng et al. | |
| 9,269,815 B2 | 2/2016 | Cai et al. | |
| 9,847,334 B1* | 12/2017 | More | H01L 27/0924 |
| 2007/0052037 A1 | 3/2007 | Luan | |
| 2010/0248481 A1 | 9/2010 | Schultz | |
| 2014/0042525 A1 | 2/2014 | Darwish et al. | |
| 2014/0106528 A1* | 4/2014 | Quyang | H01L 21/8234 438/275 |
| 2015/0349075 A1 | 12/2015 | Fan et al. | |
| 2017/0125304 A1* | 5/2017 | Wang | H01L 21/823431 |
| 2017/0125447 A1* | 5/2017 | Cheng | H01L 21/845 |
| 2018/0069005 A1 | 3/2018 | Sporer et al. | |
| 2018/0114729 A1* | 4/2018 | Lee | H01L 21/823821 |

OTHER PUBLICATIONS

Notice of Allowance with cited art in corresponding U.S. Appl. No. 16/000,153 dated Mar. 12, 2019.

\* cited by examiner

VERTICAL TRANSPORT FIN FIELD EFFECT TRANSISTORS ON A SUBSTRATE WITH VARYING EFFECTIVE GATE LENGTHS

BACKGROUND

Technical Field

The present invention generally relates to forming multiple vertical transport fin field effect transistors (VT Fin-FETs) having different effective gate lengths on a substrate, and more particularly to fabricating VT FinFETS on adjoining regions of a substrate, where VT FinFETs on a first region have different effective gate lengths than the VT FinFETs on the adjoining second region.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin approximately rectangular Si, commonly referred to as the fin with a gate on the fin, as compared to a metal-oxide-semiconductor field effect transistor (MOS-FET) with a gate parallel with the plane of the substrate.

Depending on the doping of the source and drain, an n-type FET (NFET) or a p-type FET (PFET) can be formed. An NFET and a PFET can be coupled to form a complementary metal oxide semiconductor (CMOS) device, where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present invention, a method of forming vertical transport fin field effect transistors, including, forming a bottom source/drain layer on a substrate, forming a channel layer on the exposed surface of the bottom source/drain layer, forming a recess in the channel layer on a second region of the substrate, wherein the bottom surface of the recess is below the surface of the channel layer on a first region of the substrate, forming a top source/drain layer on the channel layer, wherein the top source/drain layer fills in the recess and covers at least a portion of the channel layer on the first region of the substrate, such that the top source/drain layer has a greater thickness on the second region of the substrate than on the first region of the substrate, and forming at least one vertical fin on the first region of the substrate, and at least one vertical fin on the second region of the substrate, wherein a first top source/drain having a height, $H_1$, is formed on the at least one vertical fin on the first region of the substrate from the top source/drain layer, and a second top source/drain having a height, $H_2$, is formed on the at least one vertical fin on the second region of the substrate from the top source/drain layer is provided.

In accordance with another embodiment of the present invention, a method of forming vertical transport fin field effect transistors, including, forming a bottom source/drain layer on a substrate, forming a channel layer on the exposed surface of the bottom source/drain layer, masking a portion of the channel layer on a first region of the substrate, forming a sacrificial layer from the exposed portion of the channel layer on the second region of the substrate, removing the sacrificial layer to form a recess in the channel layer on a second region of the substrate, forming a top source/drain layer on the channel layer, wherein the top source/drain layer fills in the recess and covers at least a portion of the channel layer on the first region of the substrate, such that the top source/drain layer has a greater thickness on the second region of the substrate than on the first region of the substrate, and forming at least one vertical fin on the first region of the substrate, and at least one vertical fin on the second region of the substrate, wherein a first top source/drain having a height, $H_1$, is formed on the at least one vertical fin on the first region of the substrate from the top source/drain layer, and a second top source/drain having a height, $H_2$, is formed on the at least one vertical fin on the second region of the substrate from the top source/drain layer is provided.

In accordance with yet another embodiment of the present invention, a plurality of vertical transport fin field effect transistors on a substrate, including, a bottom source/drain layer on a substrate, wherein the bottom source/drain layer covers a first region of the substrate and an adjoining second region of the substrate, a channel layer on the exposed surface of the bottom source/drain layer, at least one vertical fin on the first region of the substrate, at least one vertical fin on the second region of the substrate, a first top source/drain having a height, $H_1$, on the at least one vertical fin on the first region of the substrate, and a second top source/drain having a height, $H_2$, on the at least one vertical fin on the second region of the substrate is provided.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
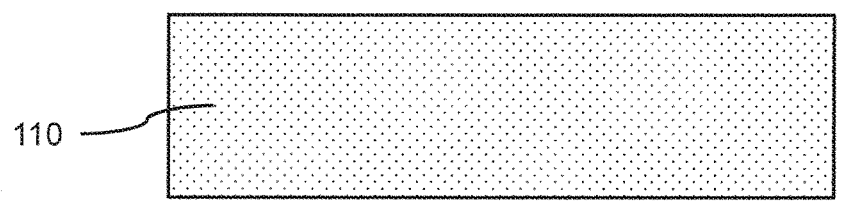
FIG. 1 is a cross-sectional side view showing a substrate, in accordance with an embodiment of the present invention.

Embodiments of the present invention relate generally to forming vertical fins on two adjoining regions of a substrate, where the vertical fins forming FinFET channels on a first region of the substrate have different effective gate lengths, $L_{Geff}^1$, than the effective gate lengths, $L_{Geff}^2$, of vertical fins forming FinFET channels on a second region of the substrate. The effective gate lengths, $L_{Geff}^1$, of the channels in the first region can be larger or smaller than the effective gate lengths, $L_{Geff}^2$, on the second region of the substrate.

Embodiments of the present invention also relate generally to forming vertical fins forming the channels of vertical transport fin field effect transistors at the same time on adjoining regions of a substrate with different effective gate lengths by forming a top source/drain layer and bottom source/drain layer separated by a predetermined thicknesses of a semiconductor before forming the individual vertical fins.

Embodiments of the present invention also relate generally to controlling the effective gate lengths of VT FinFETs by adjusting the distance between top source/drains and bottom source/drains, and the height of the top source/drains. The thickness of a section of a top source/drain layer can be determined in part by the depth of a recess formed in a portion of an underlying semiconductor layer, and in part by the thickness of the formed top source/drain layer.

Embodiments of the present invention also relate generally to forming VT FinFETs having a first effective gate length on a first region of a substrate and forming VT FinFETs having a second effective gate length different from the first effective gate length on a second region of the substrate. The VT FinFETs on a first region of the substrate and second region of the substrate can be NFETs or PFETs, where the first region and second region can be adjoining regions on the substrate, and the VT FinFETs on the adjoining regions can be the same NFET or PFET devices with different effective gate lengths.

Exemplary applications/uses to which the present invention can be applied include, but are not limited to: fabrication of VT FET devices for logic circuits (e.g., NAND, NOR, XOR, etc.), high speed memory (e.g., SRAM), and application specific integrated circuits (ASICs).

It is to be understood that the present invention will be described in terms of a given illustrative architecture; however, other architectures, structures, substrate materials and process features and steps can be varied within the scope of the present invention.

It should be noted that certain features may not be shown in all figures for the sake of clarity. This is not intended to be interpreted as a limitation of any particular embodiment, or illustration, or scope of the claims.

Reference to source/drain projections, layers, regions, etc., is intended to indicate that the particular device feature can be implemented as a source or a drain except as expressly indicated otherwise. In addition, the role of source and drain for an active device can in some instances be reversed, so a previously indicated drain may instead be a source and vice versa. Reference to a source/drain is, therefore, intended to encompass the broadest reasonable scope of the term.

Referring now to the drawings in which like numerals represent the same or similar elements and initially to FIG. 1, a cross-sectional side view of a substrate is shown, in accordance with an embodiment of the present invention.

In one or more embodiments, a substrate 110 can be a semiconductor or an insulator with an active surface semiconductor layer. The substrate can include a carrier layer that provides mechanical support for other layers of the substrate. The substrate can include crystalline, semi-crystalline, microcrystalline, or amorphous regions. The substrate can be essentially (i.e., except for contaminants) a single element (e.g., silicon), primarily (i.e., with doping) of a single element, for example, silicon (Si) or germanium (Ge), and/or the substrate can include a compound, for example, $Al_2O_3$, $SiO_2$, GaAs, SiC, Si:C, or SiGe. The substrate can also have multiple material layers, for example, a semiconductor-on-insulator substrate (SeOI), such as a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides. Other semiconductor devices may already be formed on the substrate.

In one or more embodiments, the substrate 110 can be a silicon wafer. In various embodiments, the substrate can be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

Figure 2:
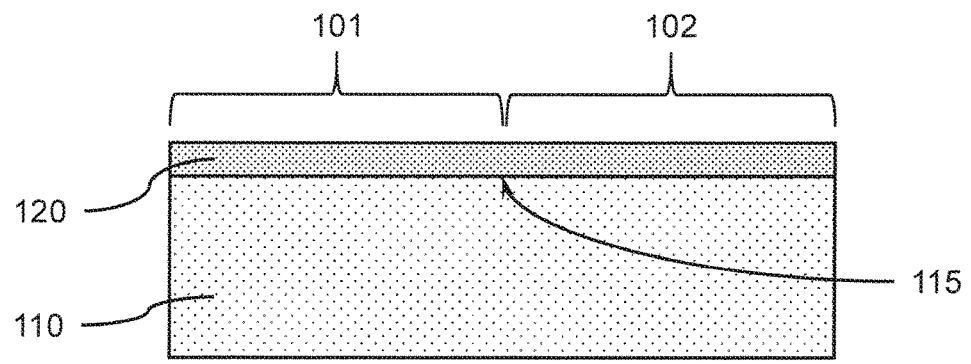
FIG. 2 is a cross-sectional side view showing a bottom source/drain layer at the surface of the substrate, in accordance with an embodiment of the present invention.

FIG. 2 is a cross-sectional side view showing a bottom source/drain layer at the surface of the substrate, in accordance with an embodiment of the present invention.

In one or more embodiments, a bottom source/drain layer 120 can be formed at the surface of the substrate, where the bottom source/drain layer 120 can be formed in or on the substrate. The bottom source/drain layer 120 can be a doped layer that includes dopant species suitable to form an n-type bottom source/drain layer 120 (e.g., phosphorus, arsenic, antimony), or dopant species suitable to form a p-type bottom source/drain layer 120 (e.g., boron, gallium, indium).

In one or more embodiments, a bottom source/drain layer 120 can be formed by epitaxially growing a bottom source/drain layer 120 on the surface 115 of the substrate 110. The bottom source/drain layer 120 can be grown by molecular beam epitaxy (MBE), vapor phase epitaxy (VPE), ion beam epitaxy (IBE), liquid-phase epitaxy (LPE), or combinations thereof. The bottom source/drain layer 120 can be doped in situ (i.e., during epitaxial growth), or ex situ (i.e., after growing the layer expitaxially). In various embodiments, the bottom source/drain layer 120 can have a different chemical composition than the substrate and/or vertical fin(s), for example, the bottom source/drain layer 120 can be silicon-germanium (SiGe) and the substrate can be silicon. The bottom source/drain layer 120 can be grown to a predetermined thickness.

In one or more embodiments, the bottom source/drain layer 120 can be formed by dopant implantation into the surface 115 of the substrate to have a predetermined thickness.

The bottom source/drain layer 120 can be formed by any suitable doping techniques, including but not limited to, ion implantation, gas phase doping, plasma doping, plasma immersion ion implantation, cluster doping, infusion doping, liquid phase doping, solid phase doping, etc.

In various embodiments, the bottom source/drain layer 120 can be heat treated to recrystallize the bottom source/drain layer 120 and/or activate the dopant species.

In various embodiments, the bottom source/drain layer 120 can cover a first region 101 of the substrate 110 and an adjoining second region 102 of the substrate 110.

Figure 3:
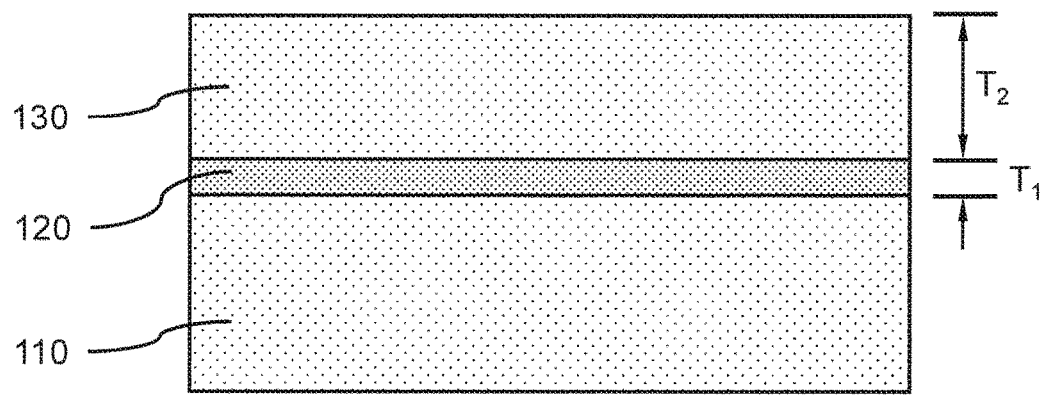
FIG. 3 is a cross-sectional side view showing a channel layer on the bottom source/drain layer, in accordance with an embodiment of the present invention.

FIG. 3 is a cross-sectional side view showing a channel layer on the bottom source/drain layer, in accordance with an embodiment of the present invention.

In one or more embodiments, a channel layer 130 can be formed on the exposed surface of the bottom source/drain layer 120, where the channel layer 130 can be formed on the exposed surface of the bottom source/drain layer 120 by an epitaxial growth process. The epitaxial growth process can be, for example, vapor phase epitaxy (VPE), ion beam epitaxy (IBE), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing chemical vapor deposition (LRPCVD), molecular beam epitaxy (MBE), liquid-phase epitaxy (LPE), or other suitable process.

In various embodiments, the channel layer 130 can be a semiconductor material, which can be an intrinsic semiconductor material, for example, silicon (Si). The channel layer 130 can be single crystal with the same crystal orientation as the bottom source/drain layer 120 surface on which the channel layer 130 is grown.

In a non-limiting exemplary embodiment, the bottom source/drain layer 120 can be boron-doped SiGe and the channel layer 130 can be intrinsic silicon (Si) to form a PFET.

In one or more embodiments, the bottom source/drain layer 120 can have a thickness, $T_1$, in the range of about 10 nm to about 50 nm, or in the range of about 20 nm to about 40 nm, or in the range of about 25 nm to about 30 nm, although other thicknesses are also contemplated.

In one or more embodiments, the channel layer 130 can have a thickness, $T_2$, in the range of about 30 nm to about 125 nm, or in the range of about 50 nm to about 100 nm, or in the range of about 60 nm to about 75 nm, although other thicknesses are also contemplated.

Figure 4:
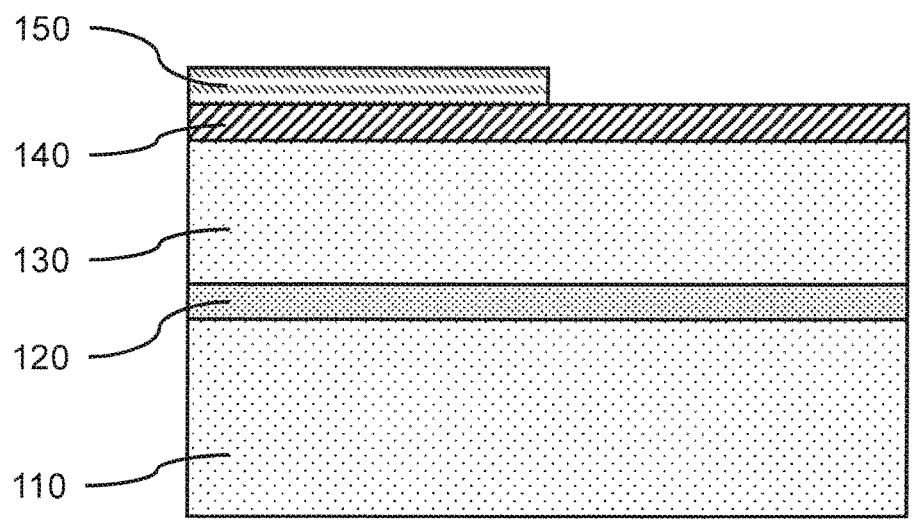
FIG. 4 is a cross-sectional side view showing a hardmask layer on the channel layer, and a patterned masking layer on the hardmask layer, in accordance with an embodiment of the present invention.

FIG. 4 is a cross-sectional side view showing a hardmask layer on the channel layer, and a patterned masking layer on the hardmask layer, in accordance with an embodiment of the present invention.

In one or more embodiments, a hardmask layer 140 can be formed on the channel layer 130. The hardmask layer can be blanket deposited, for example, by chemical vapor deposition (CVD) or plasma enhanced chemical vapor deposition (PECVD), and a chemical-mechanical polishing (CMP) used to produce a smooth, flat surface for subsequent processing.

In various embodiments, the hardmask layer 140 can be silicon oxide (SiO), silicon nitride (SiN), silicon oxynitride (SiON), silicon carbonitride (SiCN), silicon boronitride (SiBN), silicon carbide (SiC), silicon borocarbide (SiBC), silicon boro carbonitride (SiBCN), boron carbide (BC), boron nitride (BN), titanium nitride (TiN), or combinations thereof, where the hardmask layer 140 may include one or more layers. In various embodiments, the hardmask layer 140 can be stoichiometric silicon nitride ($Si_3N_4$).

In one or more embodiments, masking layer 150 can be formed and patterned on the hardmask layer 140. The masking layer 150 can be a softmask layer, for example, an organic lithography layer, or an extreme ultra violet lithography (EUVL) material that can be patterned and developed to expose a portion of the underlying hardmask layer.

In one or more embodiments, the masking layer 150 can be a positive or negative resist material, for example, Poly(methyl methacrylate) (PMMA) or SU-8, or an electron-beam (e-beam) cured material, for example, hydrogen silsesquioxane (HSQ).

Figure 5:
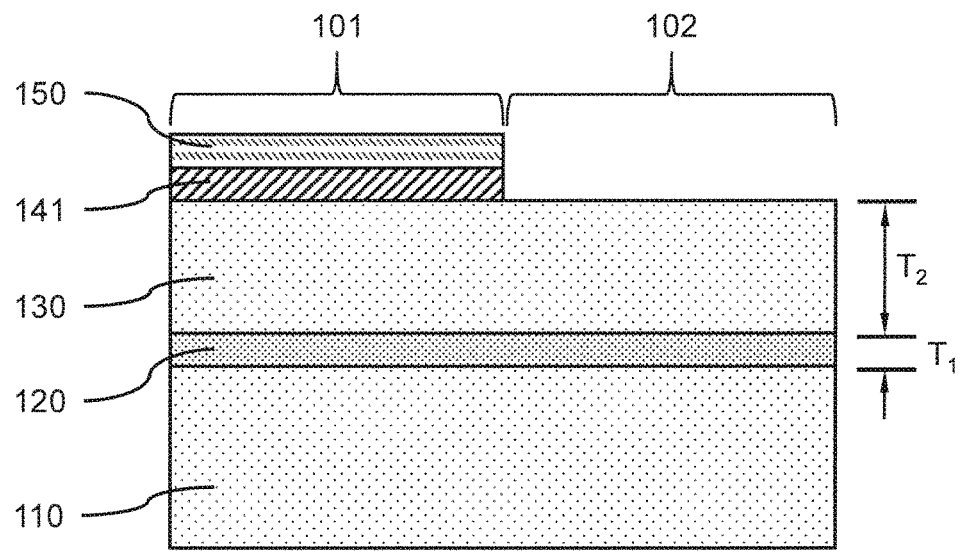
FIG. 5 is a cross-sectional side view showing a patterned masking layer on a patterned hardmask layer exposing a portion of the channel layer, in accordance with an embodiment of the present invention.

FIG. 5 is a cross-sectional side view showing a patterned masking layer on a patterned hardmask layer exposing a portion of the channel layer, in accordance with an embodiment of the present invention.

In one or more embodiments, the exposed portion of the hardmask layer 140 can be removed to expose a portion of the underlying channel layer 130 in a second region 102. The portion of the hardmask layer 140 can be removed, for example, by a directional etch (e.g., reactive ion etch (RIE)) that exposes the underlying portion of the channel layer 130. The hardmask segment 141 and masking layer 150 can cover a first region 101 of the substrate 110 adjoining the second region 102 of the substrate 110.

Figure 6:
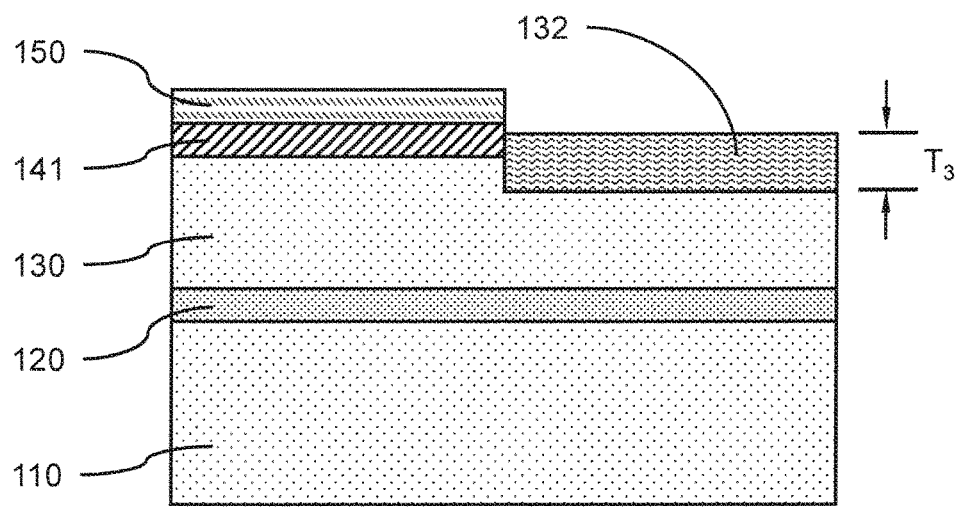
FIG. 6 is a cross-sectional side view showing the exposed portion of the channel layer partially converted to a sacrificial layer, in accordance with an embodiment of the present invention.

FIG. 6 is a cross-sectional side view showing the exposed portion of the channel layer partially converted to a sacrificial layer, in accordance with an embodiment of the present invention.

In one or more embodiments, a portion of the exposed channel layer 130 can be converted into another material composition through a reaction to form a sacrificial layer 132 from the channel layer 130.

In a non-limiting exemplary embodiment, an intrinsic silicon channel layer 130 can undergo an oxidation reaction (e.g., thermal oxidation, plasma oxidation, etc.) to form a sacrificial layer 132 of a predetermined thickness. A thickness of the intrinsic silicon channel layer 130 can be consumed at the exposed surface to form a silicon oxide (e.g., $SiO_2$) sacrificial layer 132.

In one or more embodiments, the sacrificial layer 132 can have a thickness, $T_3$, in the range of about 2 nm to about 20 nm, or in the range of about 5 nm to about 15 nm, or in the range of about 6 nm to about 10 nm, although other thicknesses are also contemplated.

Figure 7:
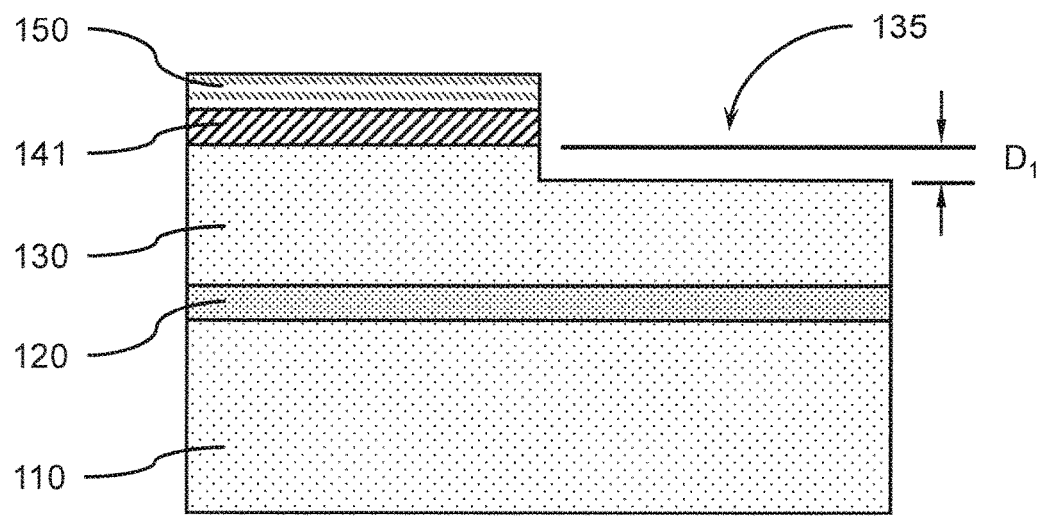
FIG. 7 is a cross-sectional side view showing the sacrificial layer removed from the substrate to form a recessed region, in accordance with an embodiment of the present invention.

FIG. 7 is a cross-sectional side view showing the sacrificial layer removed from the substrate to form a recessed region, in accordance with an embodiment of the present invention.

In one or more embodiments, the sacrificial layer 132 can be removed to form a recess 135 in the in the channel layer 130, where the sacrificial layer 132 can be removed by a selective etch, for example, RIE, an isotropic wet etch, an isotropic dry plasma etch, etc. Reduction of the thickness of the channel layer 130 can be a subtractive process, where an upper portion of the channel layer 130 is converted to a different material that can be selectively etched away.

In one or more embodiments, a portion of the exposed channel layer 130 can be directly removed, for example, by RIE, without formation of a sacrificial layer 132, to form a recess 135 with a predetermined depth, $D_1$.

In one or more embodiments, the recess 135 can have a depth, $D_1$, in the range of about 1 nm to about 10 nm, or in the range of about 2.5 nm to about 7.5 nm, or in the range of about 3 nm to about 5 nm, although other thicknesses are also contemplated.

Figure 8:
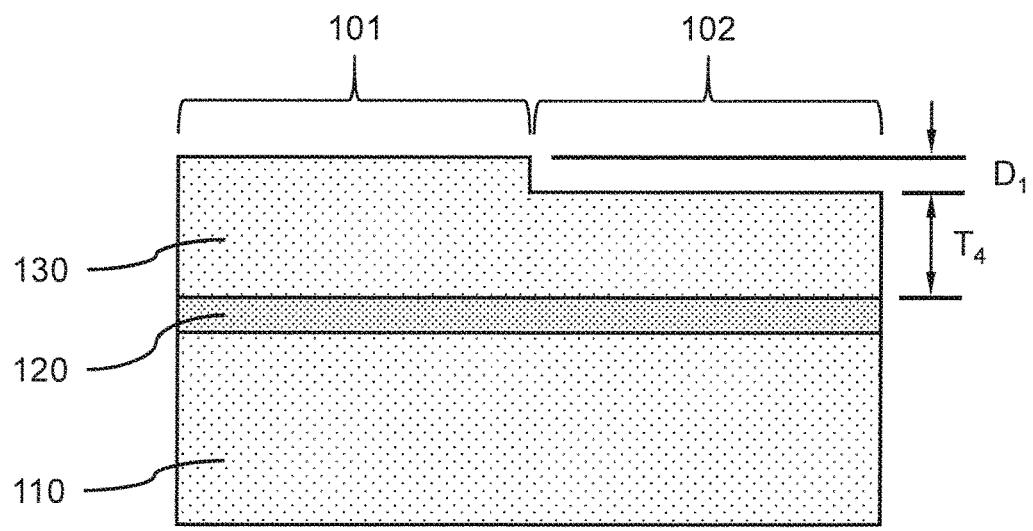
FIG. 8 is a cross-sectional side view showing the recessed region on the substrate after removal of the patterned masking layer and hardmask layer, in accordance with an embodiment of the present invention.

FIG. 8 is a cross-sectional side view showing the recessed region on the substrate after removal of the patterned masking layer and hardmask layer, in accordance with an embodiment of the present invention.

In one or more embodiments, the remaining portions of the masking layer 150 and patterned hardmask layer 140 can be removed to expose the underlying portion of the channel layer 130 in the first region 101. The masking layer 150 can be removed by stripping and/or ashing, as would be known in the art, and the hardmask layer 140 can be removed by a selective isotropic etch (e.g., wet etch).

In one or more embodiments, a step is formed between the bottom surface of the recess 135 and the top surface of the channel layer 130, where the portion of the channel layer 130 with the unreduced height can define the first region 101 on the substrate 110, and the recessed portion of the channel layer can define the second region 102 on the substrate. The effective gate lengths, $L_{Geff}^1$, of the channels in the first region 101 can be determined by the thickness, $T_2$, whereas the effective gate lengths, $L_{Geff}^2$, on the second region 102 of the substrate can be determined by the thickness, $T_4=T_2-D_1$.

Figure 9:
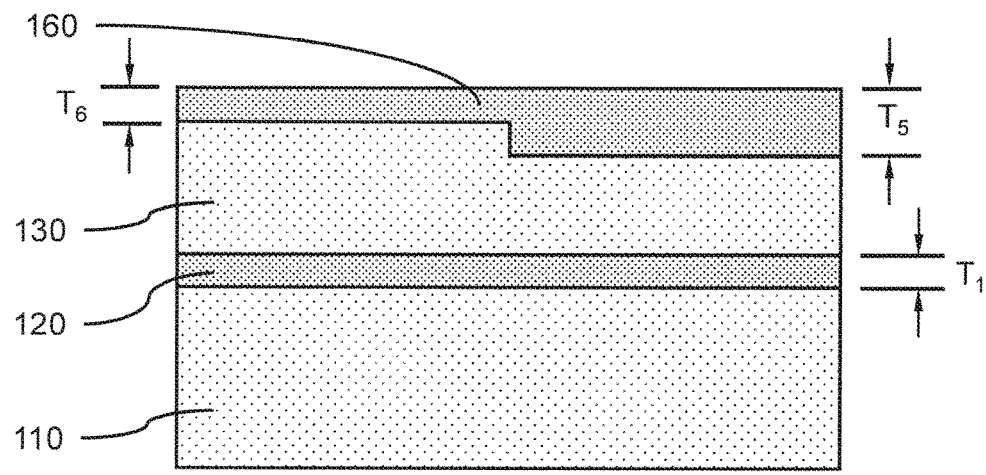
FIG. 9 is a cross-sectional side view showing a top source/drain layer formed on the substrate and filling the recess to provide varying thicknesses, in accordance with an embodiment of the present invention.

FIG. 9 is a cross-sectional side view showing a top source/drain layer formed on the substrate and filling the recess to provide varying thicknesses, in accordance with an embodiment of the present invention.

In one or more embodiments, a top source/drain layer 160 can be formed on the surface of the channel layer 130, where the top source/drain layer 160 can be epitaxially grown on the channel layer 130. The top source/drain layer 160 can be formed to a thickness, $T_5$, greater than the depth, $D_1$, of the recess 135 by thickness, $T_6$, such that the top source/drain layer 160 covers the channel layer 130 over both the first region 101 and second region 102. A CMP can be used to remove a top portion of the top source/drain layer 160 to reduce the thickness to a predetermined value, and provide a smooth, flat surface.

In one or more embodiments, the top source/drain layer 160 can be a doped layer that includes dopant species suitable to form an n-type top source/drain layer 160 (e.g., phosphorus, arsenic, antimony), or dopant species suitable to form a p-type top source/drain layer 160 (e.g., boron, gallium, indium). The dopant can be determined by the type (e.g., NFET, PFET) of device being formed, where the top source/drain layer can be doped to be n-type or p-type to match the polarity of the bottom source/drain layer.

In one or more embodiments, the top source/drain layer 160 can have a thickness, $T_5$, in the range of about 11 nm to about 60 nm, or in the range of about 21 nm to about 50 nm, or in the range of about 26 nm to about 40 nm, although other thicknesses are also contemplated. The top source/drain layer 160 can have a thickness, $T_6$, in the range of about 10 nm to about 50 nm, or in the range of about 20 nm to about 40 nm, or in the range of about 25 nm to about 30 nm, although other thicknesses are also contemplated. The thickness, $T_6$, of the top source/drain layer 160 can be the same as the thickness, $T_1$, of the bottom source/drain layer 120, and less than thickness, $T_5$.

In one or more embodiments, the top source/drain layer 160, channel layer 130, and bottom source/drain layer 120 can have a combined thickness, $T_7$, where the combined thickness, $T_7$, on the first region 101 of the substrate 110 is the same as the combined thickness, $T_7$, on the second region 102 of the substrate. The top source/drain layer 160 can have a uniform flat surface across the first region 101 and the second region 102.

Figure 10:
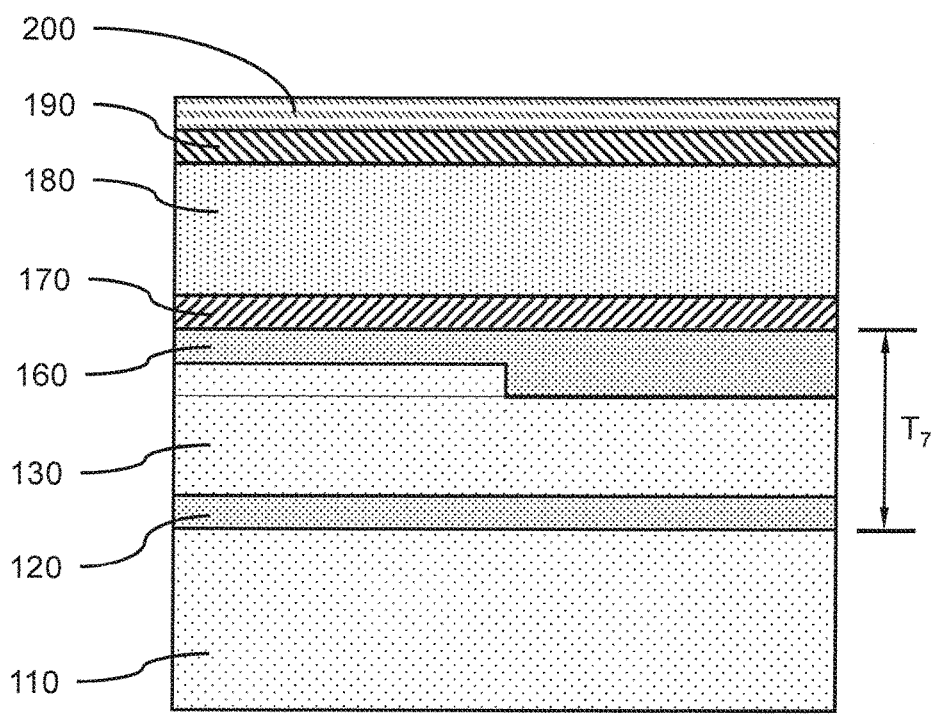
FIG. 10 is a cross-sectional side view showing a fin template layer on the top source/drain layer, a mandrel layer formed on the fin template layer, a mandrel template layer formed on the mandrel layer, and a mandrel mask layer formed on the mandrel template layer, in accordance with an embodiment of the present invention.

FIG. 10 is a cross-sectional side view showing a fin template layer on the top source/drain layer, a mandrel layer formed on the fin template layer, a mandrel template layer formed on the mandrel layer, and a mandrel mask layer formed on the mandrel template layer, in accordance with an embodiment of the present invention.

In one or more embodiments, a fin template layer 170 can be formed on at least a portion of a surface of the top source/drain layer 160, where the fin template layer 170 can cover a portion of a first region 101 and a portion of a second region 102 of the substrate 110. In various embodiments, the fin template layer 170 can be formed on the top source/drain layer 160 by CVD, PECVD, PVD, thermal growth, or combinations thereof, where the fin template layer 170 can be blanket deposited on the substrate.

In various embodiments, a fin template layer 170 can be a hard mask layer for masking the top source/drain layer 160, channel layer 130, and bottom source/drain layer 120 for transfer of a vertical fin pattern to the top source/drain layer 160 and channel layer 130. The fin template layer 170 can be silicon oxide (SiO), silicon nitride (SiN), silicon oxynitride (SiON), silicon carbonitride (SiCN), silicon boronitride (SiBN), silicon carbide (SiC), silicon borocarbide (SiBC), silicon boro carbonitride (SiBCN), boron carbide (BC), boron nitride (BN), titanium nitride (TiN), or combinations thereof, where the fin template layer 170 may include one or more layers. The fin template layer 170 can also act as an etch-stop layer for forming sacrificial mandrels from a mandrel layer, where the fin template layer 170 can be selectively etched relative to other layers. In one or more embodiments, the fin template layer 170 can be silicon nitride (SiN), for example, $Si_3N_4$.

In one or more embodiments, a mandrel layer 180 can be formed on at least a portion of the fin template layer 170. In one or more embodiments, the mandrel layer 180 can be formed by CVD, PECVD, PVD, a spin-on process, or combinations thereof, where the mandrel layer 180 can be blanket deposited on the fin template layer 170.

In various embodiments, mandrel layer 180 can be a sacrificial material that can be easily and selectively patterned and etched. The mandrel layer 180 can be amorphous silicon (a-Si), poly-silicon (p-Si), amorphous carbon (a-C), silicon-germanium (SiGe), an organic planarization layer (OPL), silicon oxide (SiO), silicon nitride (SiN), or suitable combinations thereof.

In one or more embodiments, a mandrel template layer 190 can be formed on the mandrel layer 180, where the mandrel template layer can be a hard mask layer. In various embodiments, the mandrel template layer can be optional, and other processes can be used (e.g., direct write).

In various embodiments, the mandrel template layer 190 can be a silicon oxide (SiO), a silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof, where the mandrel template layer 190 may include one or more layers.

In one or more embodiments, a mandrel mask layer 200 can be formed on the mandrel template layer 190, where the mandrel mask layer 200 can be a hard mask layer or soft mask layer for masking the mandrel template layer 190. In one or more embodiments, the mandrel mask layer 200 can be a lithographic resist material (e.g., a photo resist material, an e-beam resist material, etc.), that can be patterned to form a sacrificial mandrel pattern. Mandrel mask segments 201 can cover portions of the mandrel template layer 190 and expose other portions of the mandrel template layer.

In one or more embodiments, the mandrel mask layer 200 can be a positive or negative resist material, for example, Poly(methyl methacrylate) (PMMA) or SU-8, or an electron-beam (e-beam) cured material, for example, hydrogen silsesquioxane (HSQ).

Figure 11:
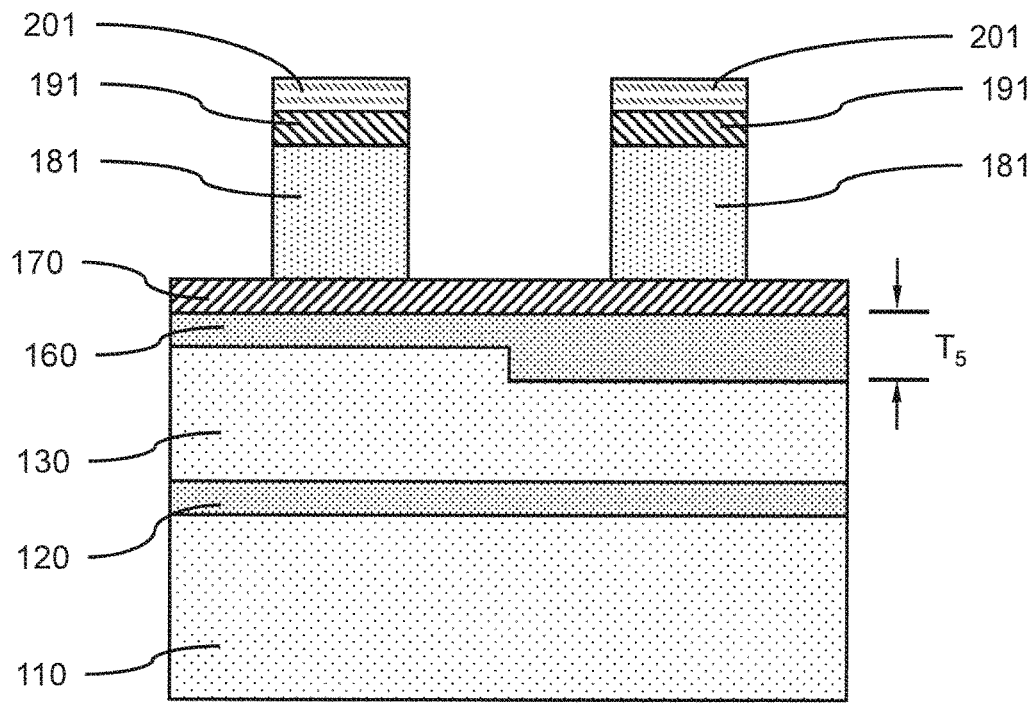
FIG. 11 is a cross-sectional side view showing a mandrel mask and patterned mandrel template on each of a plurality of sacrificial mandrels formed on the fin template layer, in accordance with an embodiment of the present invention.

FIG. 11 is a cross-sectional side view showing a mandrel mask and patterned mandrel template on each of a plurality of sacrificial mandrels formed on the fin template layer, in accordance with an embodiment of the present invention.

In one or more embodiments, the mandrel mask layer 200 can be patterned and developed to form mandrel mask segments 201 and expose portions of the mandrel mask layer 190. Removal of the exposed portions of the mandrel template layer 190 can form one or more mandrel templates 191 below the mandrel mask segments 201, and expose underlying portions of the mandrel layer 180. The mandrel templates 191 can be used to transfer the mandrel pattern to the mandrel layer 180.

In various embodiments, the exposed portions of the mandrel template layer 190 can be removed to form mandrel templates 191 by wet etching or by a dry plasma etch, where the dry plasma can be a directional reactive ion etch (RIE).

In one or more embodiments, once the mandrel templates 191 are formed, a directional etch (e.g., RIE) can be used to remove exposed portions of the mandrel layer 180 to form sacrificial mandrels 181 on the underlying fin template layer 170. Portions of the fin template layer 170 can be exposed between the sacrificial mandrel(s) 181.

Figure 12:
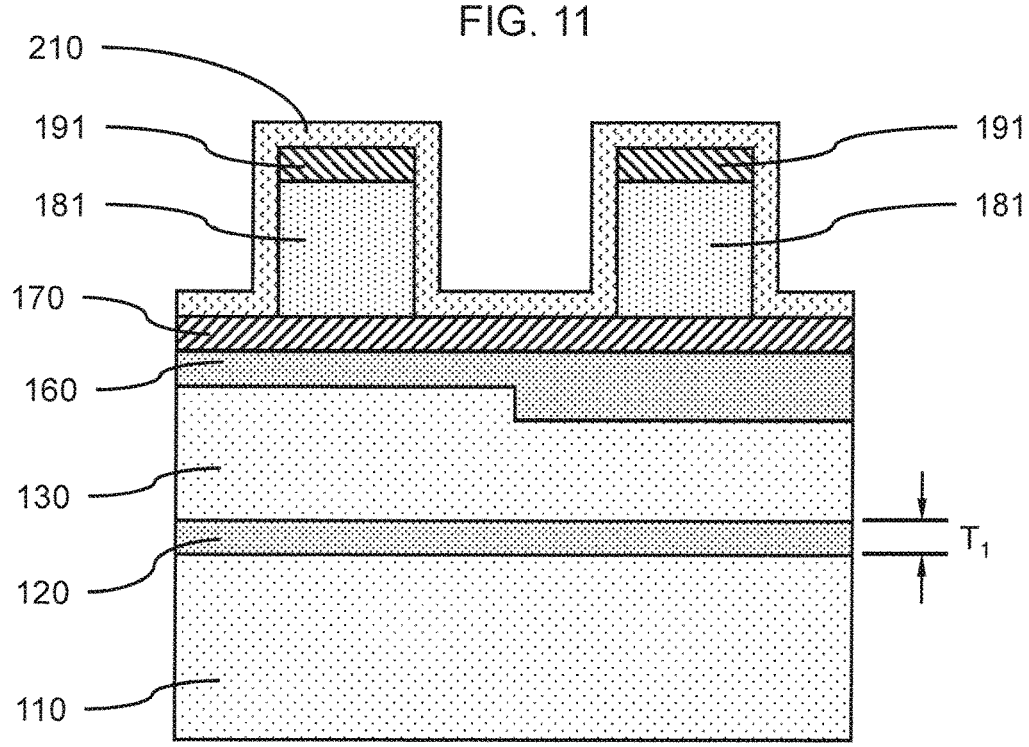
FIG. 12 is a cross-sectional side view showing a sidewall layer formed on the mandrel templates, sacrificial mandrels, and fin template layer after removal of the mandrel masks, in accordance with an embodiment of the present invention.

FIG. 12 is a cross-sectional side view showing a sidewall layer formed on the mandrel templates, sacrificial mandrels, and fin template layer after removal of the mandrel masks, in accordance with an embodiment of the present invention.

In one or more embodiments, the mandrel mask segments 201 can be removed to expose the mandrel templates 191, for example, by stripping or ashing.

In one or more embodiments, a sidewall spacer layer 210 can be formed on the exposed surfaces of the mandrel templates 191 and sacrificial mandrels 181, where the sidewall spacer layer 210 can be formed by a conformal deposition, for example, atomic layer deposition (ALD) or plasma enhanced atomic layer deposition (PEALD), to control the thickness of the sidewall spacer layer 210.

In various embodiments, the sidewall spacer layer 210 can have a thickness in the range of about 7 nm to about 40 nm, or about 7 nm to about 15 nm, or about 10 nm to about 20 nm, where the thickness of the sidewall spacer layer 210 can determine the initial width of subsequently formed sidewall spacers.

In various embodiments, the sidewall spacer layer 210 can be silicon oxide (SiO), silicon nitride (SiN), silicon oxynitride (SiON), silicon carbide (SiC), conformal amorphous carbon (a-C), or combinations thereof.

In one or more embodiments, a sacrificial mandrel 181 and sidewall spacer layer 210 can be formed on a first region 101 of the substrate 110, and a sacrificial mandrel 181 and sidewall spacer layer 210 can be formed on a second region 102 of the substrate 110. The sacrificial mandrels 181 and sidewall spacer layer 210 can be used to form vertical fins on two different regions of the substrate with two different effective gate lengths at the same time.

Figure 13:
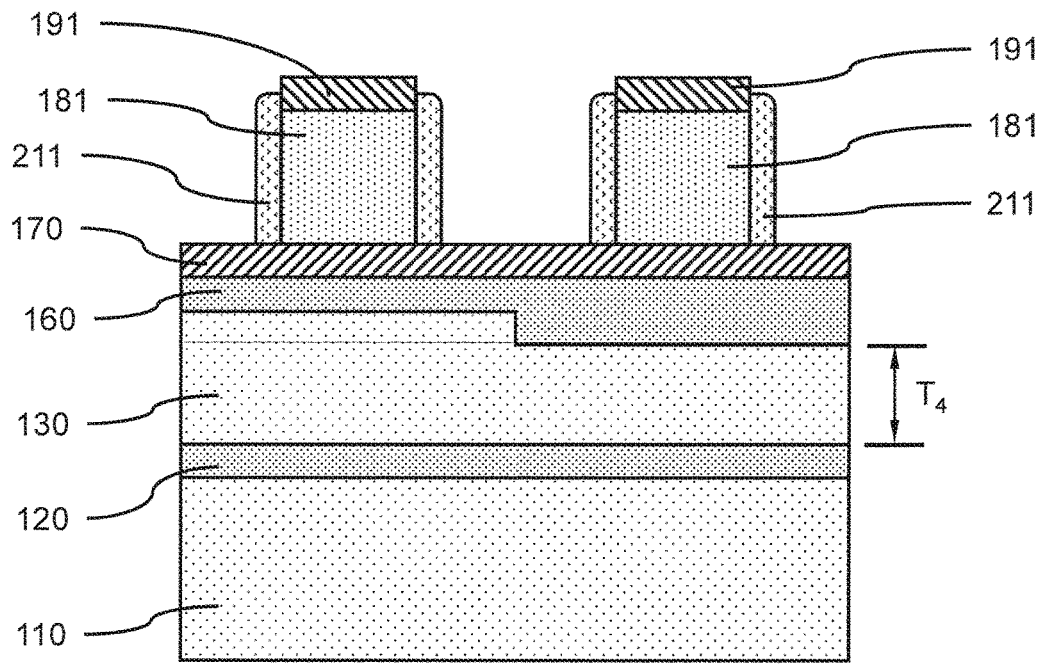
FIG. 13 is a cross-sectional side view showing sidewalls spacers formed on opposite sides of the sacrificial mandrels and mandrel templates, in accordance with an embodiment of the present invention.

FIG. 13 is a cross-sectional side view showing sidewalls spacers formed on opposite sides of the sacrificial mandrels and mandrel templates, in accordance with an embodiment of the present invention.

In one or more embodiments, a portion of the sidewall spacer layer 210 on the fin template layer 170 and the top surfaces of the mandrel templates 191 can be removed by an etch-back process using a directional etch, for example, RIE to remove the portion of the sidewall spacer layer on surfaces approximately perpendicular to the incident ion beam, while the sidewall spacer layer 210 on the vertical sidewalls of the sacrificial mandrels 181 remain essentially unetched. The remaining portion of the sidewall spacer layer 210 on the sacrificial mandrels 181 can form sidewall spacers 211, where the thickness of the sidewall spacer layer can determine the width of the sidewall spacers.

In various embodiments, a plurality of vertical fins can be formed by a sidewall image transfer (SIT) process, self-aligned double patterning (SADP), or self-aligned quadruple patterning (SAQP) to provide a tight pitch between vertical fins. In various embodiments, a direct print can be used to provide fins. Immersion Lithography can direct print down to about 78 nm pitch. Extreme ultraviolet lithography (also known as EUV or EUVL), considered a next-generation lithography technology using an extreme ultraviolet (EUV) wavelength, can direct print down to a pitch smaller than 50 nm. Self-aligned double patterning (SADP) can achieve down to about 40 nm to 60 nm fin pitch. Self-aligned quadruple patterning (SAQP) may be used to go down to below 40 nm fin pitch. While the figures illustrate a sidewall image transfer (SIT) process, this is for descriptive purposes, since these other processes are also contemplated, and the scope of the claims and invention should not be limited to the particular illustrated features.

Figure 14:
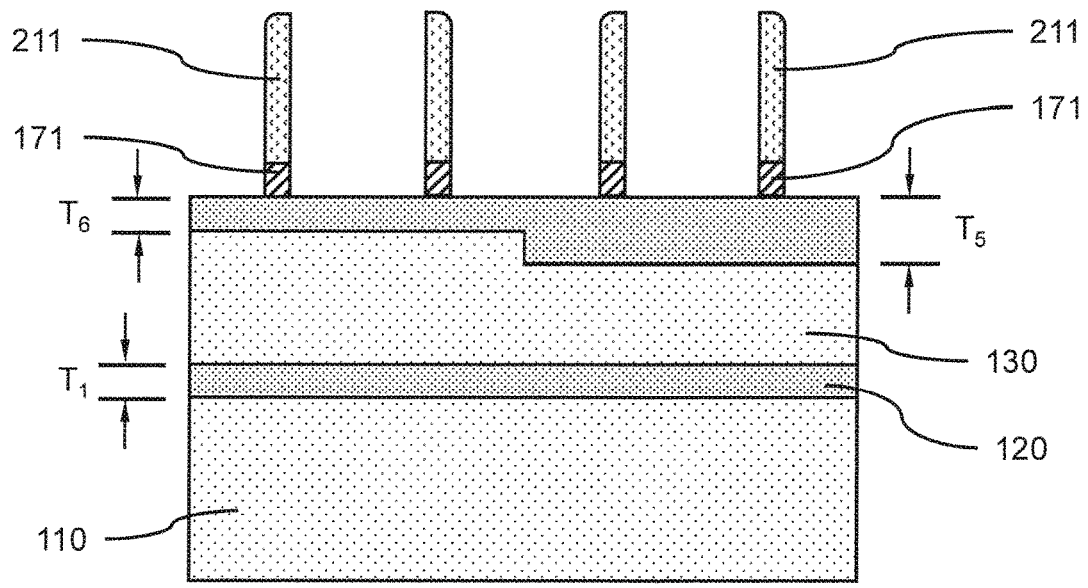
FIG. 14 is a cross-sectional side view showing a sidewall spacer on each of a plurality of fin templates after removal of the sacrificial mandrels and mandrel templates, in accordance with an embodiment of the present invention.

FIG. 14 is a cross-sectional side view showing a sidewall spacer on each of a plurality of fin templates after removal of the sacrificial mandrels and mandrel templates, in accordance with an embodiment of the present invention.

In one or more embodiments, the mandrel templates 191 and sacrificial mandrels 181 can be removed after the sidewalls spacers 211 are formed, where the mandrel templates 191 and sacrificial mandrels 181 can be removed by selective etching (e.g., RIE or wet etch). The mandrel templates 191 and sacrificial mandrels 181 can be selectively removed, while the sidewalls spacers 211 remain on the fin template layer 170 forming a fin pattern. The sidewalls spacers 211 can be made of a different material from the mandrel templates 191 and sacrificial mandrels 181, so the mandrel templates 191 and sacrificial mandrels 181 can be selectively removed.

In one or more embodiments, one or more sidewalls spacers 211 can be formed on a first region 101 of the substrate 110 having a bottom source/drain layer 120 with a thickness, $T_1$, and a top source/drain layer 160 with a thickness, $T_6$. One or more sidewalls spacers 211 can be formed on a second region 102 of the substrate 110 having a bottom source/drain layer 120 with a thickness, $T_1$, and a top source/drain layer 160 with a thickness, $T_5$, where $T_5>T_1$ and $T_5>T_6$. The thickness, $T_4$, of the channel layer 130 in the second region 102 can be less than the thickness, $T_2$, of the channel layer 130 in the first region 101. Channels formed on a first region 101 of the substrate can have different effective gate lengths, $L_{Geff}^1$, than the effective gate lengths, $L_{Geff}^2$, of channels formed on the second region 102 of the substrate due to the different channel layer thicknesses, $T_2$, $T_4$. The overall thickness, $T_7$, can be the same in both regions.

In one or more embodiments, the fin pattern formed by the sidewalls spacers 211 can be transferred to the fin template layer 170 by removing the exposed portion of the fin template layer 170. In various embodiments, a portion of the fin template layer 170 can be removed to form a fin template 171 below each of the one or more sidewall spacers 211 by a directional RIE. Removal of the portions of the fin template layer 170 can expose portions of the underlying top source/drain layer 160 between each of the sidewall spacers 211 and fin templates 171.

Figure 15:
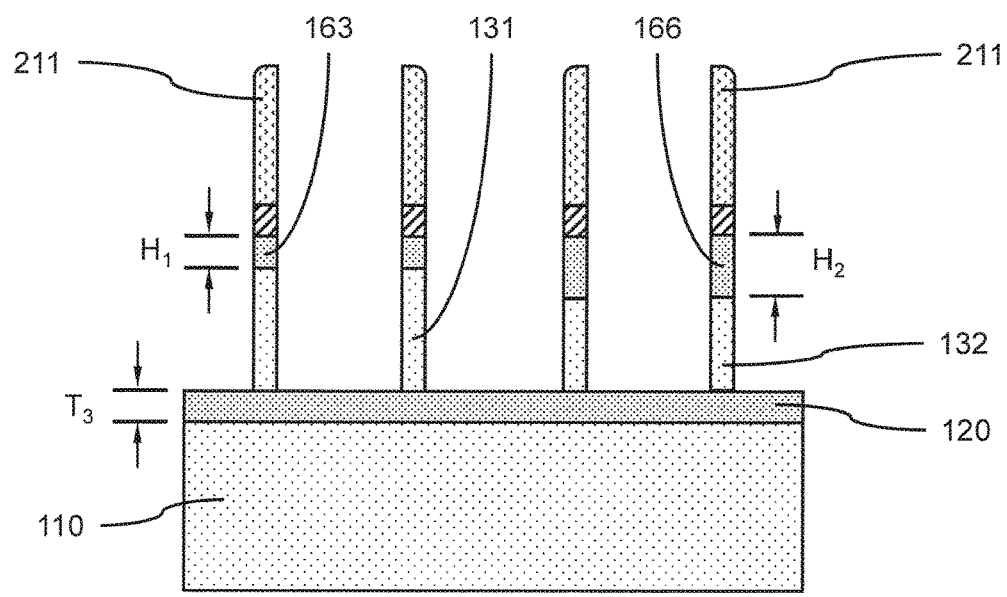
FIG. 15 is a cross-sectional side view showing a plurality of vertical fins with top source/drains having different heights and channels of different lengths on a bottom source/drain layer, in accordance with an embodiment of the present invention.

FIG. 15 is a cross-sectional side view showing a plurality of vertical fins with top source/drains having different heights and channels of different lengths on a bottom source/drain layer, in accordance with an embodiment of the present invention.

In one or more embodiments, one or more vertical fin(s) 131 can be formed on the bottom source/drain layer 120, where the vertical fin(s) 131 can be formed by removing a portion of the channel layer 130 between and/or around a sidewall spacer 211 and fin template 171. The vertical fin(s) 131, 132 can be formed by a directional etch, for example, a reactive ion etch (RIE) that removes the portion of the channel layer 130 and top source/drain layer 160 not covered by a sidewall spacer 181 and fin template 171.

In one or more embodiments, a top source/drain 163, 166 can be formed on the one or more vertical fin(s) 131, 132 by removing a portion of the top source/drain layer 160 between and/or around a sidewall spacer 211 and fin template 171. The one or more top source/drains 163, 166 can be formed by a directional etch, for example, a reactive ion etch (RIE) that removes the portion of the top source/drain layer 160 not covered by a sidewall spacer 181 and fin template 171.

In one or more embodiments, the top source/drains 163 in the first region 101 can have a height, $H_1$, from the underlying vertical fin 131 related to the thickness, $T_6$. The top source/drains 166 in the second region 102 can have a height, $H_2$, from the underlying vertical fin 132 related to the thickness, $T_5$. The height of the vertical fins 132 in the second region 102 can be less than the height of the vertical fins 131 in the first region 101, such that channels formed by the vertical fins 131 in the first region 101 have longer effective gate lengths, $L_{Geff}^1$, than the effective gate lengths, $L_{Geff}^2$, of channels formed from the vertical fins 132 in the second region 102. The top surface of the top source/drain(s) 163 on the first region 101 can be at the same height from the top surface of the bottom source/drain layer 120 as the top surface of the top source/drain(s) 166 on the second region 102, since the top source/drains 163, 166 are formed from the same top source/drain layer 160. The top source/drains 163, 166 can formed at the same time.

In one or more embodiments, the top source/drains 166 in the second region 102 can have a height, $H_2$, in the range of about 11 nm to about 60 nm, or in the range of about 21 nm to about 50 nm, or in the range of about 26 nm to about 40 nm, although other thicknesses are also contemplated. The top source/drains 163 in the first region 101 can have a height, $H_1$, in the range of about 10 nm to about 50 nm, or in the range of about 20 nm to about 40 nm, or in the range of about 25 nm to about 30 nm, although other thicknesses are contemplated. The height, $H_2$, of the second top source/drain can be greater than the height, $H_1$, of the first top source/drain by about 1 nm to about 10 nm.

Figure 16:
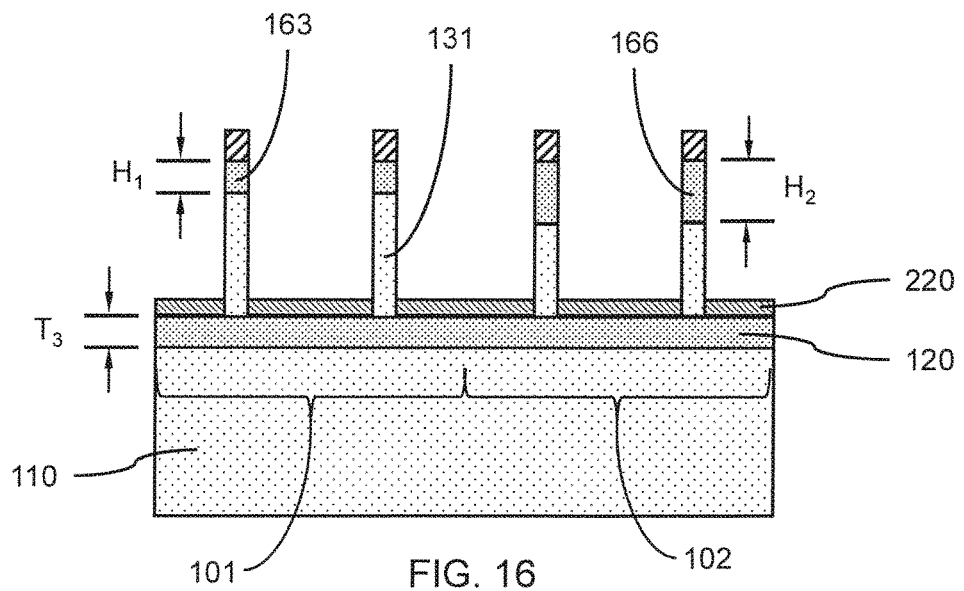
FIG. 16 is a cross-sectional side view showing a bottom spacer layer on the bottom source/drain layer, and the vertical fins after removal of the sidewall spacers, in accordance with an embodiment of the present invention.

FIG. 16 is a cross-sectional side view showing a bottom spacer layer on the bottom source/drain layer, and the vertical fins after removal of the sidewall spacers, in accordance with an embodiment of the present invention.

In one or more embodiments, the sidewall spacers 211 can be removed from the fin templates 171 and top source/drains 163, 166. The sidewall spacers 181 can be removed, for example, by a selective isotropic dry etch, a selective RIE process, or a selective wet etch. The underlying fin template(s) 171 can act as an etch stop. The fin template(s) 171 can remain on the top source/drains 163, 166 after the sidewall spacers 181 are removed, and be subsequently removed by a separate selective etch.

In one or more embodiments, a bottom spacer layer 220 can be formed on the exposed portions of the bottom source/drain layer 120.

In one or more embodiments, the bottom spacer layer 220 can be formed on the exposed surfaces of the bottom source/drain layer 120 by a directional deposition, for example, by high density plasma (HDP) depositions, gas cluster ion beam (GCIB), or combinations thereof.

In various embodiments, the bottom spacer layer 220 can be a silicon oxide (SiO), a silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof In one or more embodiments, the bottom spacer layer 220 can have a thickness in the range of about 2 nm to about 7 nm, or in the range of about 3 nm to about 5 nm. The bottom spacer layer 220 can cover a lower portion of the vertical fins 131, 132.

Figure 17:
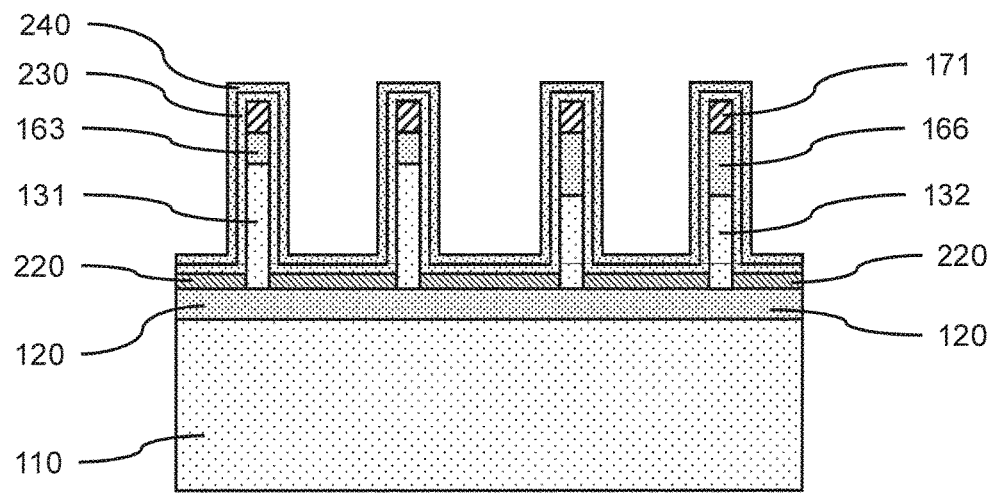
FIG. 17 is a cross-sectional side view showing a gate dielectric layer and a work function layer on the bottom spacer layer, vertical fins, top source/drains, and fin templates, in accordance with an embodiment of the present invention.

FIG. 17 is a cross-sectional side view showing a gate dielectric layer and a work function layer on the bottom spacer layer, vertical fins, top source/drains, and fin templates, in accordance with an embodiment of the present invention.

In one or more embodiments, a gate dielectric layer 230 can be formed on the exposed surfaces of the bottom spacer layer 220, vertical fins 131, 132, top source/drains 163, 166, and fin templates 171, where the gate dielectric layer 230 can be blanket (e.g., CVD, PECVD) or conformally (e.g., ALD, PEALD) deposited.

In one or more embodiments, the gate dielectric layer 230 can be an insulating dielectric layer, for example, a silicon oxide (SiO), silicon nitride (SiN), silicon oxynitride (SiON), a high-K dielectric, or a suitable combination of these materials.

In various embodiments, the gate dielectric layer 230 can be a high-K dielectric material that can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide (Pb($Sc_xTa_{1-x}$)$O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In one or more embodiments, the gate dielectric layer 230 can have a thickness in the range of about 1 nm to about 4 nm, or can have a thickness in the range of about 1 nm to about 2 nm.

In one or more embodiments, a work function layer 240 can be formed on the exposed surfaces of the gate dielectric layer 230, where the work function layer 240 can be conformally deposited by ALD, PEALD, CVD, PECVD, or combinations thereof.

In one or more embodiments, a work function layer 240 can be formed on the gate dielectric layer 230, where the work function layer 240 and gate dielectric layer 230 can surround at least a portion of each of one or more vertical fin(s) 131, 132 as a part of a gate structure. The work function layer 240 can be formed on the gate dielectric layer 230 to adjust the electrical properties of a gate electrode. In various embodiments, the work function layer 240 can be optional. A portion of the work function layer 240 can be formed on the gate dielectric layer 230 on the sidewalls of the vertical fins 131, 132 and top source/drains 163, 166. In various embodiments, different work function layers can be formed for the nFETs and pFETs, respectively.

In various embodiments, a work function layer 240 can be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer 240 can include multiple layers of work function materials, for example, a work function layer can be a TiN/TiC stack.

In various embodiments, the work function layer 240 can have a thickness in the range of about 1 nm to about 11 nm, or can have a thickness in the range of about 3 nm to about 5 nm.

Figure 18:
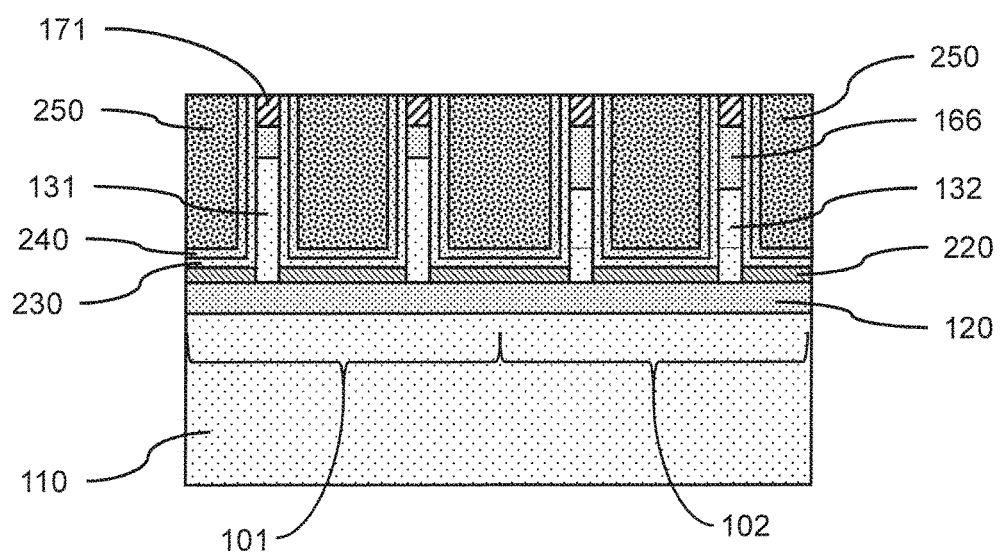
FIG. 18 is a cross-sectional side view showing a gate fill layer on the work function layer, gate dielectric layer, and bottom spacer layer, in accordance with an embodiment of the present invention.

FIG. 18 is a cross-sectional side view showing a gate fill layer on the work function layer, gate dielectric layer, and bottom spacer layer, in accordance with an embodiment of the present invention.

In one or more embodiments, a gate fill layer 250 can be formed on the gate dielectric layer 230 and/or work function layer 240 if present, where the gate fill layer 250 can fill in the space between vertical fins 131, 132. The gate fill layer 250, gate dielectric layer 230, and optionally the work function layer 240, can form a gate structure on one or more vertical fin(s) 131, 132, where the gate fill layer 250 and work function layer 240 can form a conductive gate electrode.

In various embodiments, the gate fill layer 250 can be doped polycrystalline or amorphous silicon, germanium, silicon-germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

In one or more embodiments, the gate fill layer 250 can be blanket deposited, and a chemical-mechanical polishing (CMP) used to remove gate fill layer material that extends above the top surfaces of the fin templates 171, gate dielectric layer 230 and/or work function layer 240 if present, where the CMP can provide a smooth, flat surface.

Figure 19:
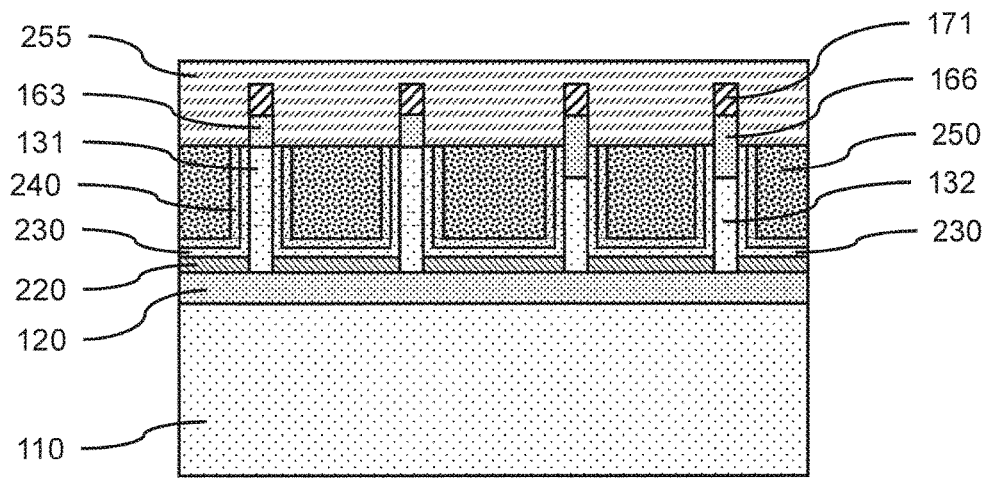
FIG. 19 is a cross-sectional side view showing a cover layer on the gate fill layer, work function layer, gate dielectric layer, and top source/drains, in accordance with an embodiment of the present invention.

FIG. 19 is a cross-sectional side view showing a cover layer on the gate fill layer, work function layer, gate dielectric layer, and top source/drains, in accordance with an embodiment of the present invention.

In one or more embodiments, a portion of the gate fill layer 250 can be removed to reduce the height of the gate fill layer, where the height of the gate fill layer can be reduced, such that the top surface is about at the level of the bottom surface of the top source/drain 163 on a first region 101 of the substrate 110. The removal of the portion of the gate fill layer 250 can expose a portion of the work function layer 240 and/or gate dielectric layer 230. The exposed portions of the gate dielectric layer 230 and/or work function layer 240 if present, can be removed to form a gate structure on the portion of the vertical fin 131 intended to form a channel for a VTFET device. The gate fill layer 250, work function, layer 240, and gate dielectric layer can be removed by selective etches, for example, selective RIE and/or wet etches.

In various embodiments, the gate structure on the vertical fin 131 on the first region 101 of the substrate can extend to the bottom surface of the top source/drain 163, and the gate structure on the vertical fin 132 on the second region of the substrate can extend above the bottom surface of the top source/drain 166. The gate structures on the vertical fins 132 on the second region 102 of the substrate can overlap a portion of the top source/drains 166.

In one or more embodiments, a cover layer 255 can be formed on the gate fill layer 250, work function layer 240, gate dielectric layer 230, and top source/drains 163, 166, and fin templates 171. The cover layer 255 can be a flowable oxide or polymeric material that can patterned and etched to form an opening.

Figure 20:
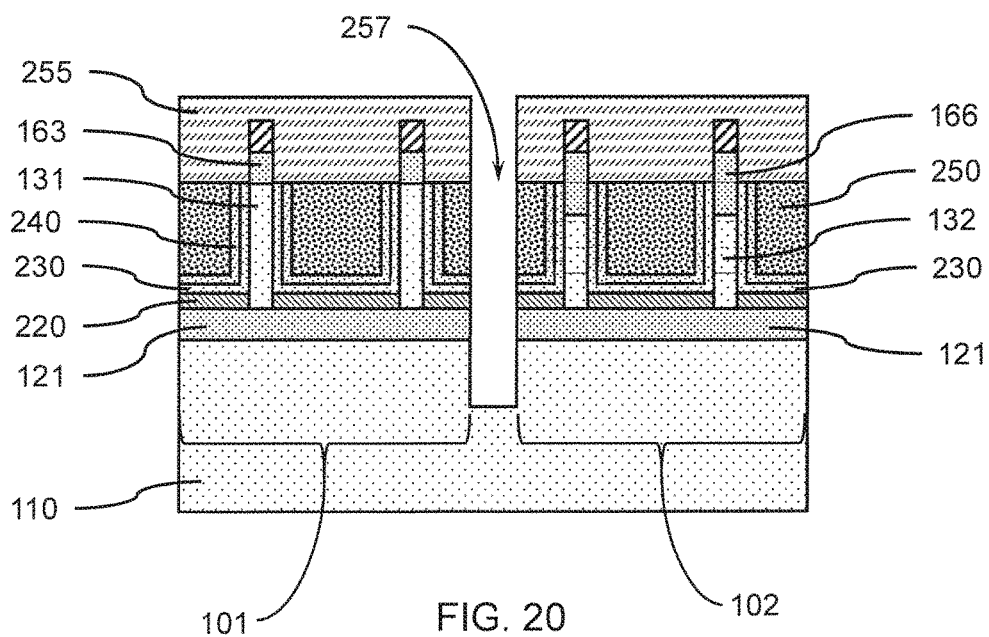
FIG. 20 is a cross-sectional side view showing an isolation trench through a gate structure, bottom spacer layer, bottom source/drain, and into the substrate to separate the vertical fins into two separate VT FinFET devices, in accordance with an embodiment of the present invention.

FIG. 20 is a cross-sectional side view showing an isolation trench through a gate structure, bottom spacer layer, bottom source/drain, and into the substrate to separate the vertical fins into two separate VT FinFET devices, in accordance with an embodiment of the present invention.

In one or more embodiments, the gate fill layer 250 can be masked by the cover layer 255 and an opening formed in the cover layer 255. A directional etch can be used to remove a portion of the gate fill layer 250, work function layer 240, and gate dielectric layer 230 to form an isolation trench 257 between vertical fins 131 formed on a first region 101 of the substrate 110 and the vertical fins 132 formed on a second region 102 of the substrate 110. The isolation trench 257 can separate a gate structure into two physically and electrically separate gate structures, where one gate structure is on a first region 101 of the substrate 110, and another gate structure is on the second region 102 of the substrate 110. The isolation trench 257 can expose the surface of the bottom source/drain layer 120, and a portion of the bottom source/drain layer 120 separated into bottom source/drains 121. The isolation trench 257 can extend through the bottom source/drain layer 120 and into the substrate 110. The bottom source/drains 121 on opposite sides of the isolation trench 257 can be doped to form n-type devices on both sides or p-type devices on both sides of the isolation trench 257, where the top source/drains 163, 166 can be doped to match the bottom source/drains 121.

In various embodiments, an isolation trench 257 can be formed in other suitable process steps, including, masking the gate fill layer 250, work function layer 240, and gate dielectric layer 230 with an organic resist, and patterning the resist to form an opening above the gate structure.

Figure 21:
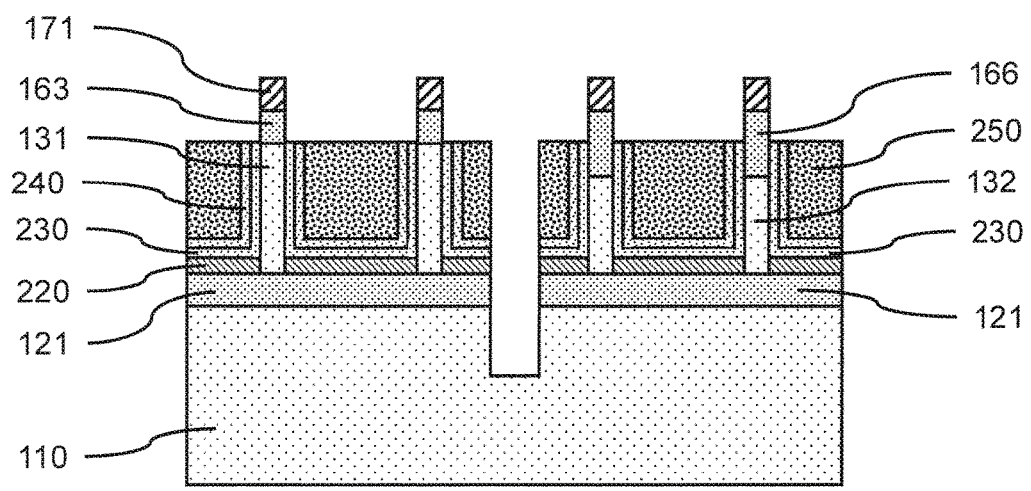
FIG. 21 is a cross-sectional side view showing the isolation trench, gate structures, and exposed top source/drains after removal of the cover layer, in accordance with an embodiment of the present invention.

FIG. 21 is a cross-sectional side view showing the isolation trench, gate structures, and exposed top source/drains after removal of the cover layer, in accordance with an embodiment of the present invention.

In one or more embodiments, the cover layer 255 can be removed after forming the isolation trench 257, where the cover layer 255 can be removed by a selective isotropic etch (e.g., a wet etch) or by chemical stripping.

Figure 22:
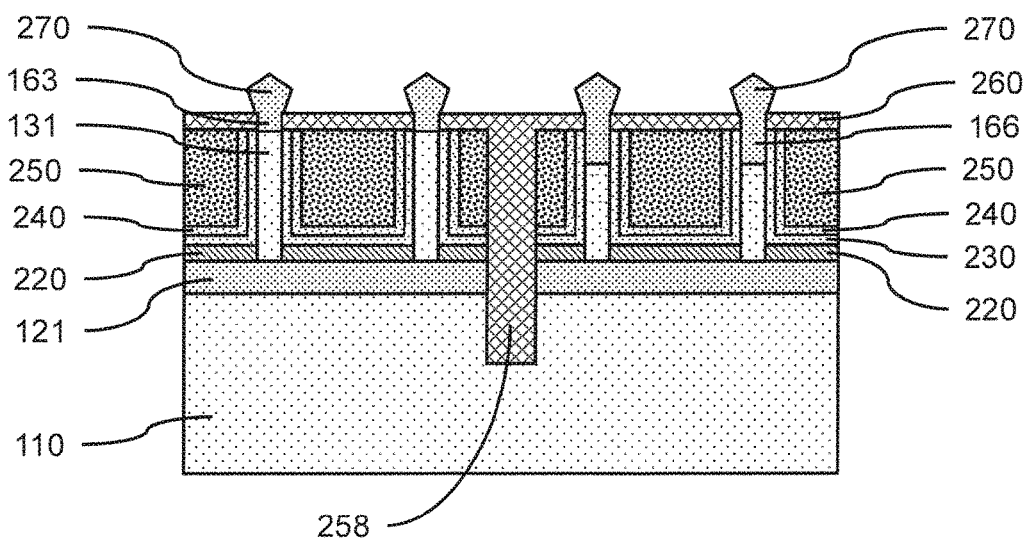
FIG. 22 is a cross-sectional side view showing enlarged top source/drains on FinFET channels with varying effective gate lengths, a top spacer layer, and filled isolation trench, in accordance with an embodiment of the present invention.

FIG. 22 is a cross-sectional side view showing enlarged top source/drains on FinFET channels with varying effective gate lengths, a top spacer layer, and filled isolation trench, in accordance with an embodiment of the present invention.

In one or more embodiments, the fin templates 171 can be removed by a selective isotropic etch (e.g., a wet etch, dry plasma etch) to expose the underlying top source/drains 163, 166.

In one or more embodiments, a top spacer layer 260 can be formed on the exposed surfaces of the gate fill layer 250, work function layer 240, and gate dielectric layer 230, where the top spacer layer 260 can cover the sidewalls of the top source/drains 163, 166 and fill in the isolation trench 257 to form an isolation region 258 between the vertical fins 131 and 132 on the two regions 101 and 102 respectively. In various embodiments, the isolation trench 257 can be filled with the same material as the top spacer layer 260 and an addition material if the width of isolation trench 257 is greater than 2× (twice) the top spacer thickness. In various embodiments, the material of the top spacer layer 260 can be etched back to reduce the top spacer layer height.

In one or more embodiments, the top spacer layer 260 can be blanket deposited, for example, by CVD, PVD, or a gas cluster ion beam deposition (GCIB), where the top spacer layer 260 may be formed on the exposed lateral surface of the gate fill layer 250, work function layer 240, and gate dielectric layer 230, but not deposited on the vertical walls of the top source/drains 163 and 166. Portions of the top spacer layer 260 that may deposit on the vertical sidewalls of the top source/drain 163 and 166 can be removed by a non-directional etch, where the etch may reduce the height (i.e., thickness) of the top spacer layer 260.

In one or more embodiments, the top spacer layer 260 can be an inorganic oxide, for example, silicon oxide (SiO) or a high-k metal oxide, or an insulating inorganic nitride, including but not limited to silicon nitride (SiN), or a silicon oxynitride (SiON).

In one or more embodiments, the top source/drains 163, 166 can be enlarged to form enlarged top source/drain 270 by further epitaxial growth on the exposed surfaces of top source/drains 163, 166.

In one or more embodiments, electrical connections can be formed that electrically connect the vertical fins 131 formed on the first region 101 and vertical fins 132 formed on a second region 102 to form VTFET devices and circuits. Electrical connections can be formed, for example, by via etching and a conductor fill to electrically connect the device components to form the NFET and PFET polarity devices. The devices may be suitably packaged and configured to form device chips, electrical circuits, etc.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein s for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation addition to the orientation depicted in the FIGS. For example, if the device in the FIGS. is turned over, elements described as "below" or "beneath" other elements or features would then be oriented "above" the other elements or features. Thus, the term. "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A plurality of vertical transport fin field effect transistors on a substrate, comprising:
    a bottom source/drain layer on a substrate, wherein the bottom source/drain layer covers a first region of the substrate and an adjoining second region of the substrate;
    at least one vertical fin on the bottom source/drain layer on the first region of the substrate;
    at least one vertical fin on the bottom source/drain layer on the second region of the substrate;
    a first top source/drain having a height, $H_1$, on the at least one vertical fin on the first region of the substrate; and
    a second top source/drain having a height, $H_2$, on the at least one vertical fin on the second region of the substrate, wherein the height, $H_2$, of the second top source/drain is greater than the height, $H_1$, of the first top source/drain.

2. The plurality of vertical transport fin field effect transistors on a substrate of claim 1, wherein the at least one vertical fin on the first region of the substrate and the at least one vertical fin on the second region of the substrate are intrinsic silicon.

3. The plurality of vertical transport fin field effect transistors on a substrate of claim 2, wherein the bottom source/drain layer and the first top source/drain are doped to form a n-type or p-type vertical transport fin field effect transistor, and the second top source/drain is doped to form a vertical transport fin field effect transistor of the same polarity as the first top source/drain.

4. The plurality of vertical transport fin field effect transistors on a substrate of claim 2, wherein the height, $H_2$, of the second top source/drain is greater than the height, $H_1$, of the first top source/drain by about 1 nm to about 10 nm.

5. The plurality of vertical transport fin field effect transistors on a substrate of claim 2, further comprising:
   a bottom spacer on the bottom source/drain layer;
   a gate structure on the at least one vertical fin on the first region of the substrate; and
   a gate structure on the at least one vertical fin on the second region of the substrate, wherein the gate structure on the at least one vertical fin on the second region of the substrate overlaps at least a portion of the second top source/drain on the at least one vertical fin on the second region of the substrate.

6. The plurality of vertical transport fin field effect transistors on a substrate of claim 5, further comprising an isolation trench that extends through the bottom spacer and bottom source/drain layer into the substrate to physically and electrically separate the gate structure and the at least one vertical fin on the first region of the substrate from the gate structure and the at least one vertical fin on the second region of the substrate.

7. The plurality of vertical transport fin field effect transistors on a substrate of claim 1, wherein the first top source/drain having a height, $H_1$, in a range of about 10 nm to about 50 nm.

8. The plurality of vertical transport fin field effect transistors on a substrate of claim 7, wherein the second top source/drain has a height, $H_2$, in a range of about 11 nm to about 60 nm.

9. The plurality of vertical transport fin field effect transistors on a substrate of claim 8, wherein the height, $H_2$, of the second top source/drain is greater than the height, $H_1$, of the first top source/drain by about 1 nm to about 10 nm.

10. A plurality of vertical transport fin field effect transistors on a substrate, comprising:
    a bottom source/drain layer on a substrate, wherein the bottom source/drain layer covers a first region of the substrate and an adjoining second region of the substrate, wherein the bottom source/drain layer includes an n-type dopant;
    at least one vertical fin on the bottom source/drain layer on the first region of the substrate;
    at least one vertical fin on the bottom source/drain layer on the second region of the substrate;
    a first top source/drain having a height, $H_1$, on the at least one vertical fin on the first region of the substrate; and
    a second top source/drain having a height, $H_2$, on the at least one vertical fin on the second region of the substrate, wherein the combined height of the first top source/drain, the at least one vertical fin on the first region of the substrate, and the bottom source/drain layer is the same as the combined height of the second top source/drain, the at least one vertical fin on the second region of the substrate, and the bottom source/drain layer, and the height, $H_2$, of the second top source/drain is greater than the height, $H_1$, of the first top source/drain.

11. The plurality of vertical transport fin field effect transistors on a substrate, of claim 10, wherein the height, $H_2$, of the second top source/drain is greater than the height, $H_1$, of the first top source/drain by about 1 nm to about 10 nm.

12. The plurality of vertical transport fin field effect transistors on a substrate, of claim 11, wherein the thickness of the bottom source/drain layer is in a range of about 10 nm to about 50 nm.

13. The plurality of vertical transport fin field effect transistors on a substrate, of claim 12, wherein the at least one vertical fin on the first region of the substrate has a height in a range of about 30 nm to about 125 nm.

14. The plurality of vertical transport fin field effect transistors on a substrate, of claim 13, wherein the at least one vertical fin on the second region of the substrate has a height in a range of about 20 nm to about 124 nm.

15. The plurality of vertical transport fin field effect transistors on a substrate of claim 14, further comprising:
    a bottom spacer on the bottom source/drain layer;
    a gate structure on the at least one vertical fin on the first region of the substrate; and
    a gate structure on the at least one vertical fin on the second region of the substrate, wherein the gate structure on the at least one vertical fin on the second region of the substrate overlaps at least a portion of the second top source/drain on the at least one vertical fin on the second region of the substrate.

16. A plurality of vertical transport fin field effect transistors on a substrate, comprising:
    a bottom source/drain layer on a substrate, wherein the bottom source/drain layer covers a first region of the substrate and an adjoining second region of the substrate, wherein the bottom source/drain layer includes an n-type dopant;
    at least one vertical fin on the bottom source/drain layer on the first region of the substrate, wherein the at least one vertical fin on the first region of the substrate has a height in a range of about 30 nm to about 125 nm;
    at least one vertical fin on the bottom source/drain layer on the second region of the substrate, wherein the at least one vertical fin on the second region of the substrate has a height in a range of about 20 nm to about 124 nm;
    a first top source/drain having a height, $H_1$, on the at least one vertical fin on the first region of the substrate;
    a bottom spacer on the bottom source/drain layer; and
    a second top source/drain having a height, $H_2$, on the at least one vertical fin on the second region of the substrate, wherein the combined height of the first top source/drain, the at least one vertical fin on the first region of the substrate, and the bottom source/drain layer is the same as the combined height of the second top source/drain, the at least one vertical fin on the second region of the substrate, and the bottom source/drain layer, and the height, $H_2$, of the second top source/drain is greater than the height, $H_1$, of the first top source/drain.

17. The plurality of vertical transport fin field effect transistors on a substrate of claim 16, further comprising a gate dielectric layer on the bottom spacer layer, the at least one vertical fin on the first region of the substrate, and the at least one vertical fin on the second region of the substrate.

18. The plurality of vertical transport fin field effect transistors on a substrate of claim 17, further comprising a work function layer on the gate dielectric layer.

19. The plurality of vertical transport fin field effect transistors on a substrate of claim 18, wherein the first top source/drain and second top source/drain are enlarged top source/drains.

20. The plurality of vertical transport fin field effect transistors on a substrate of claim 19, wherein the first top source/drain has a height, $H_1$, in a range of about 10 nm to about 50 nm, and the second top source/drain has a height, $H_2$, in a range of about 11 nm to about 60 nm.

\* \* \* \* \*